US012590370B2

(12) United States Patent
Leoncini et al.

(10) Patent No.: US 12,590,370 B2
(45) Date of Patent: Mar. 31, 2026

(54) HALIDE-FREE CO-REACTANTS FOR MOLYBDENUM FILM DEPOSITION

(71) Applicant: Applied Materials, Inc., Santa Clara, CA (US)

(72) Inventors: Andrea Leoncini, Singapore (SG); Chandan Kr Barik, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 127 days.

(21) Appl. No.: 18/530,613

(22) Filed: Dec. 6, 2023

(65) Prior Publication Data

US 2025/0188611 A1 Jun. 12, 2025

(51) Int. Cl.
*C23C 16/455* (2006.01)
*C23C 16/30* (2006.01)
*C23C 16/44* (2006.01)
*C23C 16/52* (2006.01)

(52) U.S. Cl.
CPC ........ *C23C 16/45553* (2013.01); *C23C 16/30* (2013.01); *C23C 16/4408* (2013.01); *C23C 16/52* (2013.01)

(58) Field of Classification Search
CPC .............. C23C 16/45553; C23C 16/30; C23C 16/4408; C23C 16/52; C23C 16/45527
See application file for complete search history.

(56) References Cited

U.S. PATENT DOCUMENTS

2019/0067094 A1* 2/2019 Zope ................. H01L 23/53266
2019/0226086 A1 7/2019 Wright et al.
2022/0018025 A1* 1/2022 Ma .......................... C23C 16/52
2022/0139713 A1* 5/2022 Färm ................. H01L 21/28568 438/681
2022/0220139 A1* 7/2022 Leoncini ................. C23C 16/34
2022/0372053 A1* 11/2022 Arteaga Muller ...... C23C 16/50

FOREIGN PATENT DOCUMENTS

WO 2020/076502 A1 4/2020
WO 2022155090 A1 7/2022
WO 2022/246140 A1 11/2022

OTHER PUBLICATIONS

Asirvatham, Victor S., et al., "Synthesis of Bis(n6-alkylbenzene)molybdenum by Arene Metathesis", Organometallics 2001, 20, 8, 1687-1688.
Drake, Tasha L., et al., "Vapor deposition of molybdenum oxide using bis(ethylbenzene) molybdenum and water", Journal of Vacuum Science & Technology A 34, 051403 (2016); doi: 10.1116/1.4959532.
PCT International Search Report and Written Opinion in PCT/US2024/058359 dated Mar. 17, 2025, 11 pages.

* cited by examiner

*Primary Examiner* — Michael G Miller
(74) *Attorney, Agent, or Firm* — Servilla Whitney LLC

(57) ABSTRACT

Methods for depositing molybdenum-containing films on a semiconductor substrate are described. The substrate is exposed to a bis(arene)molybdenum (0) precursor and a halide-free reactant to form the molybdenum-containing film (e.g., molybdenum metal (elemental molybdenum), molybdenum carbide, molybdenum carbonitride, molybdenum silicide, molybdenum carbosilicide, molybdenum sulfide, molybdenum carbosulfide, molybdenum nitride, molybdenum phosphide, or molybdenum carbophosphide. The exposures can be sequential or simultaneous.

20 Claims, 1 Drawing Sheet

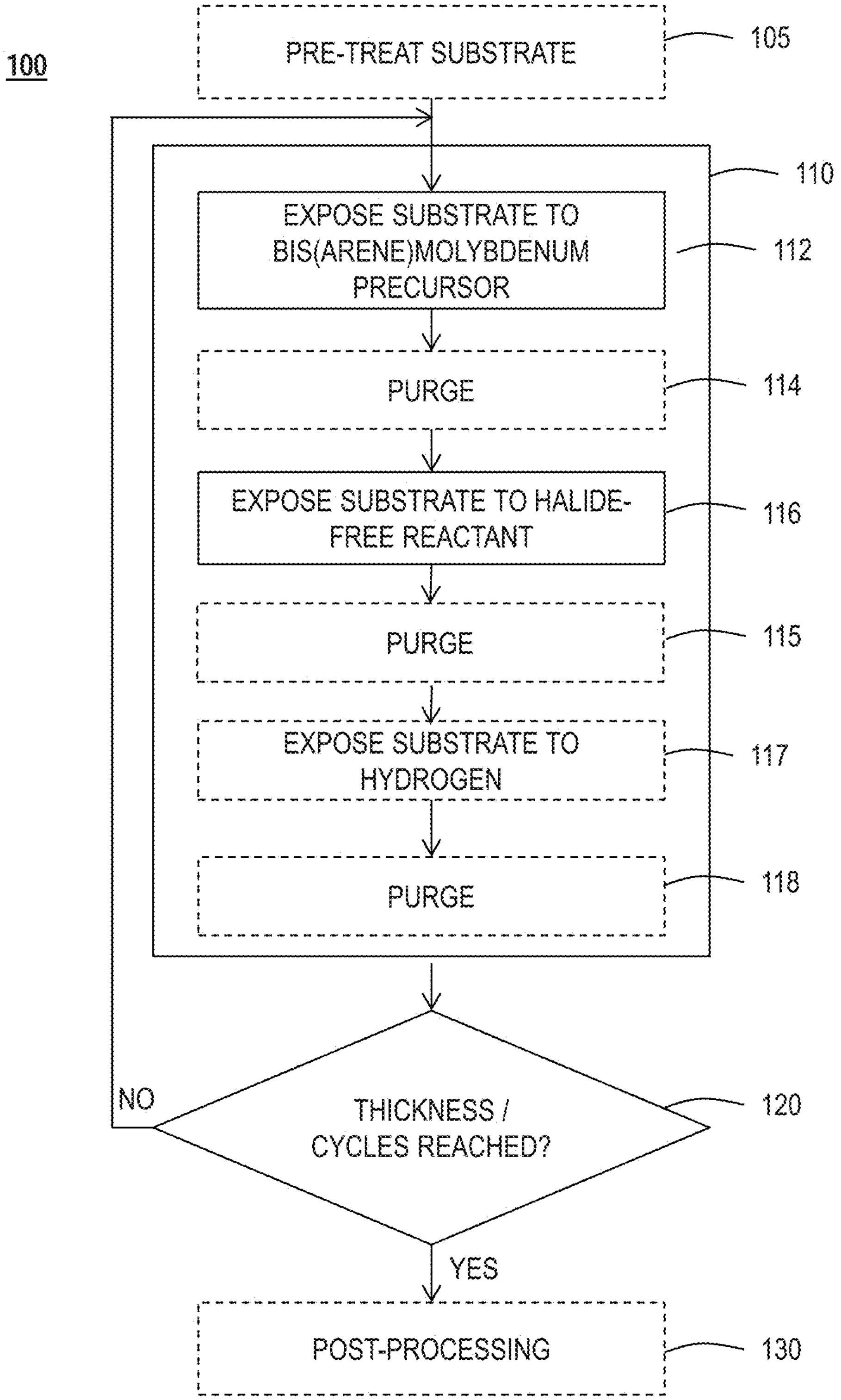
100
PRE-TREAT SUBSTRATE
105
110
EXPOSE SUBSTRATE TO BIS(ARENE)MOLYBDENUM PRECURSOR
112
PURGE
114
EXPOSE SUBSTRATE TO HALIDE-FREE REACTANT
116
PURGE
115
EXPOSE SUBSTRATE TO HYDROGEN
117
PURGE
118
NO
THICKNESS / CYCLES REACHED?
120
YES
POST-PROCESSING
130

HALIDE-FREE CO-REACTANTS FOR MOLYBDENUM FILM DEPOSITION

TECHNICAL FIELD

Embodiments of the disclosure relate halide-free reactants and methods for depositing molybdenum-containing films. More particularly, embodiments of the disclosure are directed to molybdenum-containing films formed from the reaction of bis(arene)molybdenum precursors and halide-free reactants.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

Molybdenum (Mo) and molybdenum-based films have attractive material and conductive properties. These films have been proposed and tested for applications from front end to back-end parts of semiconductor devices. Commercially viable approaches to forming molybdenum films use halide-based co-reactants or precursors and/or high temperatures. Deposition of molybdenum metal films for back end of the line (BEOL) interconnects, however, requires a halide-free process with a thermal budget below 400° C. Halide contamination may affect device performance and hence require additional removal procedures. There is, therefore, a need in the art for halide-free processes to form molybdenum metal and molybdenum-based films.

SUMMARY

One or more embodiments of the disclosure are directed to method of forming a molybdenum-containing film on a semiconductor substrate. In one or more embodiments, a method of forming a molybdenum-containing film on a semiconductor substrate comprises: exposing a substrate to a bis(arene)molybdenum precursor; and exposing the substrate to a halide-free reactant to form the molybdenum-containing film on the substrate, the halide-free reactant comprising one or more of an alkene, an imine, an amine, a nitrile, an ether, an ester, or a carbonyl.

Further embodiments of the disclosure are directed to methods of forming a molybdenum-containing film on a semiconductor substrate. In one or more embodiments, a method of forming a molybdenum-containing film on a semiconductor substrate comprises: forming a molybdenum-containing film in a process cycle comprising sequential exposure of a substrate to a bis(arene)molybdenum precursor, purge gas, a halide-free reactant, and purge gas, the halide-free reactant comprising one or more of an alkene, an imine, an amine, a nitrile, an ether, an ester, or a carbonyl.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

FIG. 1 illustrates a process flow diagram of a method in accordance with one or more embodiments of the disclosure.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Embodiments of the disclosure provide halide-free processes which result in conductive molybdenum films at temperatures less than 350° C. More specifically, provided are halide-free co-reactants for the deposition of molybdenum metal films by CVD and ALD using bis(arene)molybdenum precursors. The halide-free co-reactants react with bis(arene)molybdenum precursors at room temperature and result in molybdenum metal on the surface of semiconductor substrates. The reactivity of the halide-free co-reactants was confirmed by wet chemistry experiments. The halide-free co-reactants have been to be very volatile, liquid, and stable for an extended period of time at a delivery temperature by thermogravimetric analysis (TGA) and nuclear magnetic resonance (NMR) spectroscopy.

The reactants or co-reactants of one or more embodiments are substantially free of halide. As used herein, the term “substantially free” means that there is less than about 5%, including less than about 4%, less than about 3%, less than about 2%, less than about 1%, and less than about 0.5% of halogen, on an atomic basis, in the reactant or co-reactant. In some embodiments, the molybdenum-containing film is substantially free of halide, and there is less than about 5%, including less than about 4%, less than about 3%, less than about 2%, less than about 1%, and less than about 0.5% of halide, on an atomic basis, in the molybdenum-containing film.

A “substrate” as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor", "reactant", "reactive gas", and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time-delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Without intending to be bound by theory, it is thought that the presence of halides in the structure of the reactant can pose challenges, as halide contamination may affect device performance and hence require additional removal procedures. Halides bind strongly to metals, requiring higher thermal budget, or the use of additional reagents for its removal. Additionally, halide can redeposit and poison other metal surfaces.

Previously, commercially viable approaches to form molybdenum-containing films use halide-based co-reactants or precursors and/or high temperature. Thus, one or more embodiments provide halide-free reactants, resulting in less contamination of the molybdenum-containing film, less damage to neighboring films in the semiconductor structures, while maintaining strong device performance and shorter processing times.

Molybdenum (Mo) containing films can be formed by atomic layer deposition or chemical vapor deposition for many semiconductor applications. One or more embodiments of the disclosure advantageously provide processes for atomic layer deposition or chemical vapor deposition to form molybdenum-containing films on a semiconductor substrate. As used in this specification and the appended claims, the term "molybdenum-containing film" refers to a film that comprises molybdenum atoms and has greater than or equal to about 1 atomic % molybdenum, greater than or equal to about 2 atomic % molybdenum, greater than or equal to about 3 atomic % molybdenum, greater than or equal to about 4 atomic % molybdenum, greater than or equal to about 5 atomic % molybdenum, greater than or equal to about 10 atomic % molybdenum, greater than or equal to about 15 atomic % molybdenum, greater than or equal to about 20 atomic % molybdenum, greater than or equal to about 25 atomic % molybdenum, greater than or equal to about 30 atomic % molybdenum, greater than or equal to about 35 atomic % molybdenum, greater than or equal to about 40 atomic % molybdenum, greater than or equal to about 45 atomic % molybdenum, greater than or equal to about 50 atomic % molybdenum, or greater than or equal to about 60 atomic % molybdenum.

In some embodiments, the molybdenum-containing film comprises one or more of molybdenum metal (elemental molybdenum), molybdenum oxide ($MoO_x$), molybdenum metal (elemental molybdenum), molybdenum carbide ($MoC_x$), molybdenum carbonitride ($MoC_xN_y$), molybdenum silicide ($MoSi_x$), molybdenum carbosilicide ($MoC_xSi_y$), molybdenum sulfide ($MoS_x$), molybdenum carbosulfide ($MoC_xS_y$), molybdenum nitride ($MoN_x$), molybdenum phosphide ($MoP_x$), or molybdenum carbophosphide ($MoC_xP_y$).

The skilled artisan will recognize that the use of molecular formula, e.g., molybdenum oxide ($MoO_x$), molybdenum carbide ($MoC_x$), molybdenum carbonitride ($MoC_xN_y$), molybdenum silicide ($MoSi_x$), molybdenum carbosilicide ($MoC_xSi_y$), molybdenum sulfide ($MoS_x$), molybdenum carbosulfide ($MoC_xS_y$), molybdenum nitride ($MoN_x$), molybdenum phosphide ($MoP_x$), or molybdenum carbophosphide ($MoC_xP_y$), does not imply a specific stoichiometric relationship between the elements but merely the identity of the major components of the film. For example, $MoC_x$ refers to a film whose major composition comprises molybdenum (Mo) atoms and carbon (C) atoms. In some embodiments, the major composition of the specified film (i.e., the sum of the atomic percent of the specified atoms) is greater than or equal to about 95%, 98%, 99% or 99.5% of the film, on an atomic basis.

With reference to FIG. 1, one or more embodiments of the disclosure are directed to a method 100 of depositing a film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g., titanium nitride (TiN)). In one or more embodiments, an adhesion layer, such as titanium nitride, is deposited at operation 105.

At deposition 110, a process is performed to deposit a molybdenum-containing film on the substrate (or substrate surface). The deposition process can include one or more operations to form the molybdenum-containing film on the substrate. In operation 112, the substrate (or substrate surface) is exposed to a molybdenum precursor to deposit a precursor film on the substrate (or substrate surface). The molybdenum precursor can be any suitable molybdenum-containing compound that can react with (i.e., adsorb or chemisorb onto) the substrate surface to leave a molybdenum-containing species on the substrate surface.

In one or more embodiments, the molybdenum precursor comprises a bis(arene)molybdenum (0) precursor. The bis (arene)molybdenum (0) precursor may be any suitable bis (arene)molybdenum (0) precursor known to the skilled artisan. In one or more embodiments, the bis(arene)molybdenum (0) precursor has a general formula (I):

(I)

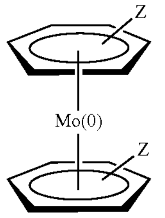

where Z is any suitable substituent known to the skilled artisan.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the molybdenum-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the molybdenum-containing layer may be at least partially formed thereon. For example, in some embodiments, a layer comprising a metal, a nitride, an oxide, or the like, or combinations thereof may be disposed on the substrate and may have the molybdenum containing layer formed upon such layer or layers.

At operation 114, the processing chamber is optionally purged to remove unreacted bis(arene)molybdenum (0) precursor, reaction products and by-products. As used in this manner, the term "processing chamber" also includes portions of a processing chamber adjacent to the substrate surface without encompassing the complete interior volume of the processing chamber. For example, in a sector of a spatially separated processing chamber, the portion of the processing chamber adjacent the substrate surface is purged of the bis(arene)molybdenum (0) precursor by any suitable technique including, but not limited to, moving the substrate through a gas curtain to a portion or sector of the processing chamber that contains none or substantially none of the bis(arene)molybdenum (0) precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas comprises one or more of hydrogen ($H_2$), nitrogen ($N_2$), helium (He), and argon (Ar).

At operation 116, the substrate (or substrate surface) is exposed to a halide-free reactant to form one or more of a molybdenum-containing film on the substrate. The halide-free reactant can react with the molybdenum-containing species on the substrate surface to form the molybdenum-containing film.

In one or more embodiments, the halide-free reactant comprises one or more of an alkene, an imine, an amine, a nitrile, an ether, an ester, or a carbonyl.

In one or more embodiments, the alkene may be selected from:

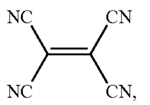 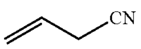 , 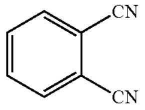 ,

-continued

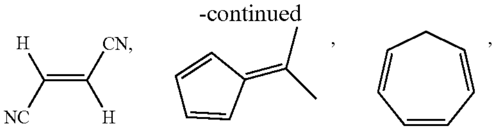

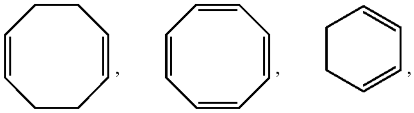

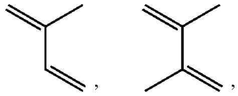

and

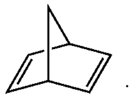

In one or more embodiments, the imine may be selected from

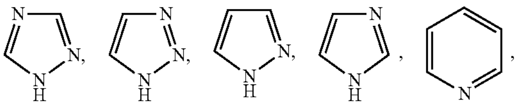

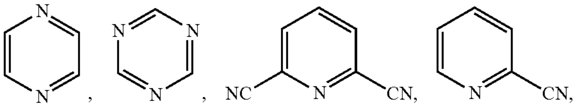

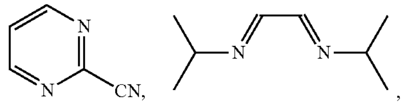

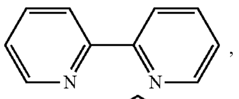

and

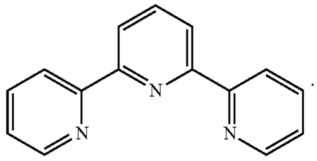

In one or more embodiments, the amine may be selected from:

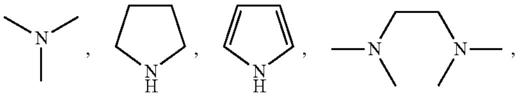

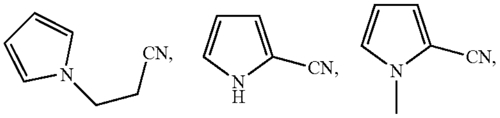

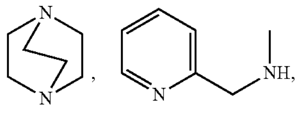

and

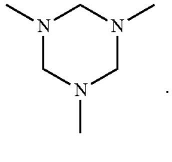

In one or more embodiments, the nitrile may be selected from:

-continued

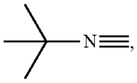

and

In one or more embodiments, the ether may be selected from:

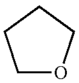

and

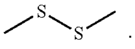

In one or more embodiments, the ester may be selected from:

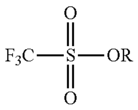

where R comprises an alkyl chain having from 1 to 6 carbon atoms and

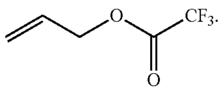

Unless otherwise indicated, the term "lower alkyl," "alkyl," or "alk" as used herein alone or as part of another group includes both straight and branched chain hydrocarbons, containing 1 to 20 carbons, or 1 to 10 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

In one or more embodiments, the carbonyl may be selected from

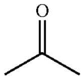

and

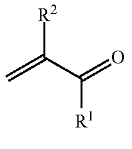

where $R^1$ and $R^2$ independently comprise an alkyl chain having from 1 to 6 carbon atoms.

In one or more embodiments, halide-free reactant may be selected from one or more of tetracyanoethylene (TCNE), allyl nitrile, alkyl triflate, allyl trifluoroacetate, 1,2,4-triazole, fulvene, cycloheptatriene, cyclooctadiene, norbornadiene, cyclooctatetraene, cyclohexadiene, 2,3-dimethylbutadiene, isoprene, 1,2,3-triazole, imidazole, pyrazole, imidazole, pyrrole, pyridine, pyrazine, triazine, 1,4-diazadiene (DAD), bipyridine, terpyridine, trimethylamine, pyrrolidine, pyrrolidine, tetramethylethylenediamine (TMEDA), triazinane, acetonitrile, isocyanide, tetrahydrofuran, acetone, dimethyldisulfide, alkyl acrylate, fumaronitrile, 1,2-dicyanobenzene, 2,6-pyridinecarbonitrile, 1-(2-cyanoethyl)pyrrole, 2-pyridinecarbonitrile, 2-pyrimidinecarbonitrile, pyrrole-2-carbonitrile, N-methyl-pyrrole-2-carbonitrile, malononitrile, succinonitrile, 2-[(methylamino)methyl]pyridine, and 1,4-diazabicyclo[2.2.2]octane (DABCO).

At operation 115, the processing chamber is optionally purged after exposure to the reactant. Purging the processing chamber in operation 115 can be the same process or different process than the purge in operation 114. Purging the processing chamber, portion of the processing chamber, area adjacent the substrate surface, etc., removes unreacted reactants, reaction products and by-products from the area adjacent the substrate surface.

At operation 117, the substrate is optionally exposed to an atmosphere of hydrogen ($H_2$(g)) to react with the bis(arene) molybdenum precursor and halide-free reactant in a reductive elimination reaction to leave a molybdenum film on the substrate surface.

At operation 118, the processing chamber is optionally purged after exposure to the reactant. Purging the processing chamber in operation 118 can be the same process or different process than the purge in operation 114, 115. Purging the processing chamber, portion of the processing chamber, area adjacent the substrate surface, etc., removes unreacted reactants, reaction products and by-products from the area adjacent the substrate surface.

At decision 120, the thickness of the deposited film, or number of cycles of bis(arene)molybdenum (0) precursor and halide-free reactant is considered. If the deposited film has reached a predetermined thickness or a predetermined number of process cycles have been performed, the method 100 moves to an optional post-processing operation 130. In some embodiments, the process cycle comprises sequential exposure of the substrate to the bis(arene)molybdenum (0) precursor, purge gas, halide-free reactant, and purge gas. If the thickness of the deposited film or the number of process cycles has not reached the predetermined threshold, the method 100 returns to operation 110 to expose the substrate surface to the bis(arene)molybdenum (0) precursor again in operation 112 and continuing.

In one or more embodiments, the method 100 comprises a pulse of a bis(arene)molybdenum (0) precursor using a carrier gas comprising a mixture of argon (Ar) and hydrogen ($H_2$) for about 3 seconds, purging the substrate using a purge gas comprising a mixture of argon (Ar) and hydrogen ($H_2$), a pulse of a halide-free reactant using a carrier gas comprising a mixture of argon (Ar), hydrogen ($H_2$), and halide-free reactant for about 1 second, and purging the substrate using a purge gas comprising a mixture of argon (Ar) and hydrogen ($H_2$). In other embodiments, the method 100 comprises a pulse of a bis(arene)molybdenum (0) precursor using a carrier gas comprising a mixture of argon (Ar) and hydrogen ($H_2$) for about 3 seconds, purging the substrate using a purge gas comprising a mixture of (Ar) and hydrogen ($H_2$), a pulse of a halide-free reactant using a carrier gas comprising hydrogen ($H_2$) and the halide-free reactant for about 1 second, and purging the substrate using a purge gas comprising hydrogen ($H_2$).

In specific embodiments, the method 100 comprises a pulse of a bis(arene)molybdenum (0) precursor using a carrier gas comprising a mixture of argon (Ar) and hydrogen ($H_2$) for about 3 seconds, purging the substrate using a purge gas comprising a mixture of argon (Ar) and hydrogen ($H_2$), a pulse of a halide-free reactant comprising tetracyanoethylene (TCNE) using a carrier gas comprising a mixture of argon (Ar), hydrogen ($H_2$), and tetracyanoethylene (TCNE) for about 1 second, and purging the substrate using a purge gas comprising a mixture of argon (Ar) and hydrogen ($H_2$). In other embodiments, the method 100 comprises a pulse of a bis(arene)molybdenum (0) precursor using a carrier gas comprising a hydrogen ($H_2$) for about 3 seconds, purging the substrate using a purge gas comprising hydrogen ($H_2$), a pulse of a halide-free reactant comprising tetracyanoethylene (TCNE) using a carrier gas comprising hydrogen ($H_2$), and tetracyanoethylene (TCNE) for about 1 second, and purging the substrate using a purge gas comprising hydrogen ($H_2$). It has been advantageously found that performing method 100 in accordance with one or more embodiments, such as in specific embodiments, yields a molybdenum-containing film that forms selectively on a metal surface relative to a dielectric surface.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 100 can be performed at any suitable temperature depending on, for example, the bis(arene)molybdenum (0) precursor, halide-free reactant, or thermal budget of the device. In one or more embodiments, the use of high temperature processing may be undesirable for temperature-sensitive substrates, such as logic devices. In some embodiments, exposure to the bis(arene)molybdenum (0) precursor (operation 112) and the halide-free reactant (operation 116) occur at the same temperature. In some embodiments, the substrate is maintained at a temperature in a range of about 20° C. to about 400° C., or about 50° C. to about 650° C.

In some embodiments, exposure to the bis(arene)molybdenum (0) precursor (operation 112) occurs at a different temperature than the exposure to the halide-free reactant (operation 116). In some embodiments, the substrate is maintained at a first temperature in a range of about 20° C. to about 400° C., or about 50° C. to about 650° C., for the exposure to the bis(arene)molybdenum (0) precursor, and at a second temperature in the range of about 20° C. to about 400° C., or about 50° C. to about 650° C., for exposure to the halide-free reactant.

In the embodiment illustrated in FIG. 1, at deposition operation 110 the substrate (or substrate surface) is exposed to the bis(arene)molybdenum (0) precursor and the halide-free reactant sequentially. In another, un-illustrated, embodiment, the substrate (or substrate surface) is exposed to the bis(arene)molybdenum (0) precursor and the halide-free reactant simultaneously in a CVD reaction. In a CVD reaction, the substrate (or substrate surface) can be exposed to a gaseous mixture of the bis(arene)molybdenum (0)

precursor and halide-free reactant to deposit a molybdenum-containing film having a predetermined thickness. In the CVD reaction, the molybdenum-containing film can be deposited in one exposure to the mixed reactive gas or can be multiple exposures to the mixed reactive gas with purges between.

In some embodiments, the molybdenum-containing film formed comprises elemental molybdenum. Stated differently, in some embodiments, the molybdenum-containing film comprises a metal film comprising molybdenum. In some embodiments, the metal film consists essentially of molybdenum. As used in this manner, the term "consists essentially of molybdenum" means that the molybdenum-containing film is greater than or equal to about 80%, 85%, 90%, 95%, 98%, 99% or 99.5% molybdenum, on an atomic basis. Measurements of the composition of the molybdenum-containing film refer to the bulk portion of the film, excluding interface regions where diffusion of elements from adjacent films may occur.

The deposition operation 110 can be repeated to form a molybdenum-containing film having a predetermined thickness. In some embodiments, the deposition operation 110 is repeated to provide one or more of a molybdenum-containing film, such as a film comprising molybdenum metal (elemental molybdenum), molybdenum oxide ($MoO_x$), molybdenum carbide ($MoC_x$), molybdenum carbonitride ($MoC_xN_y$), molybdenum silicide ($MoSi_x$), molybdenum carbosilicide ($MoC_xSi_y$), molybdenum sulfide ($MoS_x$), molybdenum carbosulfide ($MoC_xS_y$), molybdenum nitride ($MoN_x$), molybdenum phosphide ($MoP_x$), or molybdenum carbophosphide ($MoC_xP_y$), having a thickness in the range of about 0.3 nm to about 100 nm, or in the range of about 30 Å to about 10 μm.

One or more embodiments of the disclosure are directed to methods of depositing molybdenum-containing films in high aspect ratio features. A high aspect ratio feature is a trench, via or pillar having a height:width ratio greater than or equal to about 10, 20, 50, 100, or more. In some embodiments, the molybdenum-containing film is deposited conformally on the high aspect ratio feature. As used in this manner, a conformal film has a thickness near the top of the feature that is in the range of about 80 to 120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom (e.g., a nitride) and a second material (e.g., an oxide) at the sidewalls. The molybdenum-containing film deposits selectively on the first material relative to the second material so that the molybdenum-containing film fills the feature in a bottom-up manner.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at the front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as rapid thermal processing (RTP), plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrate are individually loaded into the first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled locally to change the substrate temperature. In some embodiments, a heater/cooler is positioned within the chamber adjacent to the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1: Atomic Layer Deposition of Molybdenum-Containing Films

General procedure: A silicon substrate is placed in a processing chamber. A bis(arene)molybdenum (0) precursor is flowed into the processing chamber in an atmosphere of nitrogen ($N_2$) gas over the silicon substrate leaving a molybdenum-precursor terminated surface. Unreacted precursor and byproducts are then purged out of the chamber. Next, a halide-free co-reactant is then introduced into the chamber that reacts with the surface-bound molybdenum species. Again, excess halide-free co-reactant and byproducts are removed from the chamber. The resultant material on the substrate is a molybdenum-containing film.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a molybdenum-containing film on a semiconductor substrate, the method comprising:

exposing a substrate to a bis(arene)molybdenum (0) precursor having a general formula (I)

(I)

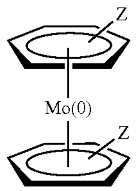

wherein Z is a substituent; and exposing the substrate to a halide-free reactant to form the molybdenum-containing film on the substrate, the halide-free reactant having less than 5% of halogen on an atomic basis and comprising one or more of an alkene, an imine, an amine, a nitrile, an ether, an ester, or a carbonyl.

2. The method of claim 1, wherein the alkene is selected from:

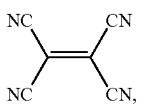 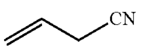, 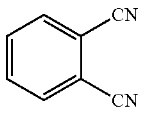,

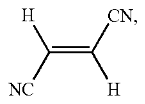 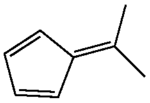, 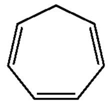,

-continued

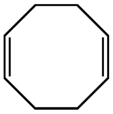, 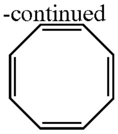, 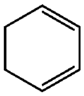,

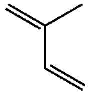, 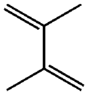, and 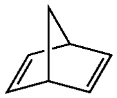.

3. The method of claim 1, wherein the imine is selected from:

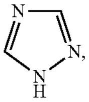 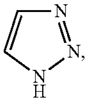 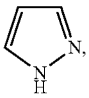 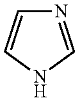, 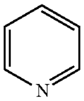,

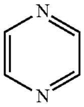, 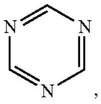, 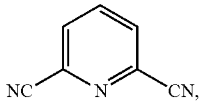 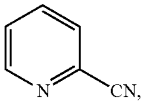

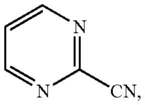 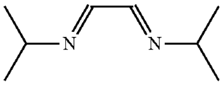,

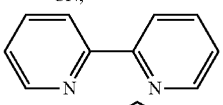, and

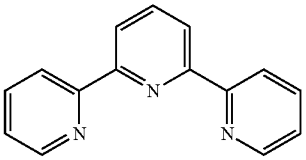.

4. The method of claim 1, wherein the amine is selected from:

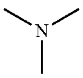, 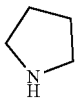, 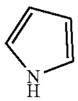,

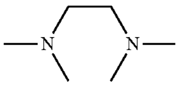, 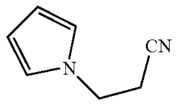,

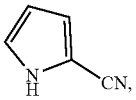 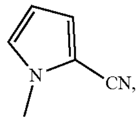 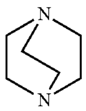,

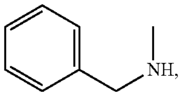 and 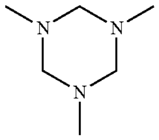.

5. The method of claim 1, wherein the nitrile is selected from:

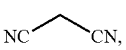 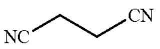,

-continued

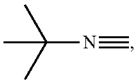, and

6. The method of claim 1, wherein the ether is selected from:

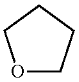 and 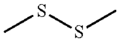.

7. The method of claim 1, wherein the ester is selected from:

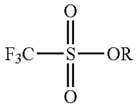

where R comprises an alkyl chain having from 1 to 6 carbon atoms and

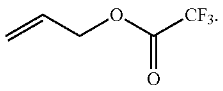

8. The method of claim 1, wherein the carbonyl is selected from:

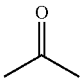 and 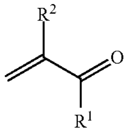

where $R^1$ and $R^2$ independently comprise an alkyl chain having from 1 to 6 carbon atoms.

9. The method of claim 1, wherein the halide-free reactant comprises tetracyanoethylene (TCNE).

10. The method of claim 1, wherein the method is one or more of chemical vapor deposition or atomic layer deposition.

11. The method of claim 1, wherein the halide-free reactant is reacted with the bis(arene)molybdenum precursor at a temperature in a range of from 100° C. to 400° C.

12. The method of claim 1, wherein the molybdenum-containing film comprises one or more of molybdenum metal (elemental Mo), molybdenum oxide ($MoO_x$), molybdenum carbide ($MoC_x$), molybdenum carbonitride ($MoC_xN_y$), molybdenum silicide ($MoSi_x$), molybdenum carbosilicide ($MoC_xSi_y$), molybdenum sulfide ($MoS_x$), molybdenum carbosulfide ($MoC_xS_y$), molybdenum nitride ($MoN_x$), molybdenum phosphide ($MoP_x$), or molybdenum carbophosphide ($MoC_xP_y$).

13. The method of claim 1, wherein the substrate is exposed to the bis(arene)molybdenum precursor and the halide-free reactant sequentially.

14. The method of claim 1, wherein the substrate is exposed to the bis(arene)molybdenum precursor and the halide-free reactant simultaneously.

15. The method of claim 1, further comprising purging the substrate of the bis(arene)molybdenum precursor prior to exposing the substrate to the halide-free reactant.

16. The method of claim 15, wherein purging comprises one or more of applying a vacuum or flowing a purge gas over the substrate.

17. The method of claim 16, wherein the purge gas comprises one or more of hydrogen ($H_2$), nitrogen ($N_2$), helium (He), and argon (Ar).

18. The method of claim 1, further comprising repeating the method to provide the molybdenum-containing film having a thickness of about 0.3 to about 100 nm.

19. A method of forming a molybdenum-containing film on a semiconductor substrate, the method comprising:

forming the molybdenum-containing film in a process cycle comprising sequential exposure of a substrate to a bis(arene)molybdenum (0) precursor, purge gas, a halide-free reactant, and purge gas, the halide-free reactant having less than 5% of halogen on an atomic basis and comprising one or more of an alkene, an imine, an amine, a nitrile, an ether, an ester, or a carbonyl, and the bis(arene)molybdenum (0) precursor having a general formula (I)

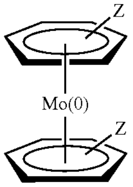

(I)

wherein Z is a substituent.

20. The method of claim 19, wherein the halide-free reactant is selected from one or more of tetracyanoethylene (TCNE), allyl nitrile, alkyl triflate, allyl trifluoroacetate, 1,2,4-triazole, fulvene, cycloheptatriene, cyclooctadiene, norbornadiene, cyclooctatetraene, cyclohexadiene, 2,3-dimethylbutadiene, isoprene, 1,2,3-triazole, imidazole, pyrazole, imidazole, pyrrole, pyridine, pyrazine, triazine, 1,4-diazadiene (DAD), bipyridine, terpyridine, trimethylamine, pyrrolidine, pyrrolidine, tetramethylethylenediamine (TMEDA), triazinane, acetonitrile, isocyanide, tetrahydrofuran, acetone, dimethyldisulfide, alkyl acrylate, fumaronitrile, 1,2-dicyanobenzene, 2,6-pyridinecarbonitrile, 1-(2-cyanoethyl)pyrrole, 2-pyridinecarbonitrile, 2-pyrimidinecarbonitrile, pyrrole-2-carbonitrile, N-methylpyrrole-2-carbonitrile, malononitrile, succinonitrile, 2-[(methylamino)methyl]pyridine, and 1,4-diazabicyclo [2.2.2]octane (DABCO).

* * * * *